(12) United States Patent
Robinson et al.

(10) Patent No.: US 11,347,987 B2
(45) Date of Patent: May 31, 2022

(54) METHOD OF MAKING AN OPTICALLY READABLE ELEMENT

(71) Applicant: Quantum Base Limited, Stockport (GB)

(72) Inventors: Benjamin Robinson, Stockport (GB); Robert James Young, Stockport (GB)

(73) Assignee: Quantum Base Limited, Stockport (GB)

( * ) Notice: Subject to any disclaimer, the term of this patent is extended or adjusted under 35 U.S.C. 154(b) by 0 days.

(21) Appl. No.: 16/966,943

(22) PCT Filed: Feb. 6, 2019

(86) PCT No.: PCT/GB2019/050320
§ 371 (c)(1),
(2) Date: Aug. 3, 2020

(87) PCT Pub. No.: WO2019/155205
PCT Pub. Date: Aug. 15, 2019

(65) Prior Publication Data
US 2021/0049433 A1 Feb. 18, 2021

(30) Foreign Application Priority Data
Feb. 7, 2018 (GB) .................................... 1802011

(51) Int. Cl.
*G06K 19/06* (2006.01)
*H01L 33/04* (2010.01)
(Continued)

(52) U.S. Cl.
CPC ....... *G06K 19/06046* (2013.01); *G06V 20/80* (2022.01); *H01L 33/04* (2013.01); *G06V 20/95* (2022.01)

(58) Field of Classification Search
CPC ........ G06K 19/00; G06K 19/04; G06K 19/06; G06K 19/0646
(Continued)

(56) References Cited

U.S. PATENT DOCUMENTS

| 10,685,199 | B2 * | 6/2020 | Gaathon | G06K 19/06037 |
| 2013/0008962 | A1 * | 1/2013 | Anand | G06K 19/07 235/454 |
| 2013/0320087 | A1 * | 12/2013 | Moran | G06K 19/14 235/440 |

FOREIGN PATENT DOCUMENTS

| EP | 0997837 A2 | 5/2000 |
| EP | 3252740 A1 | 12/2017 |

(Continued)

OTHER PUBLICATIONS

International Search Report for corresponding PCT Application No. PCT/GB2019/050320 dated Apr. 30, 2019, 3 pages.

*Primary Examiner* — Edwyn Labaze
(74) *Attorney, Agent, or Firm* — Hoffman Warnick LLC

(57) ABSTRACT

According to a first aspect of the present invention, there is provided a method of making an optically readable element, the method comprising: providing one or more optically readable structures in or on a body, a strain being applied to the one or more optically readable structures as a result of an interaction between the body and the one or more optically readable structures; the one or more optically readable structures each having an intrinsic band structure prior to application of the strain, and wherein the applied strain changes that intrinsic band structure; and wherein the interaction is such that the strain is maintained, after the element has been made, without the need for an external influence.

20 Claims, 6 Drawing Sheets

Figure 1:
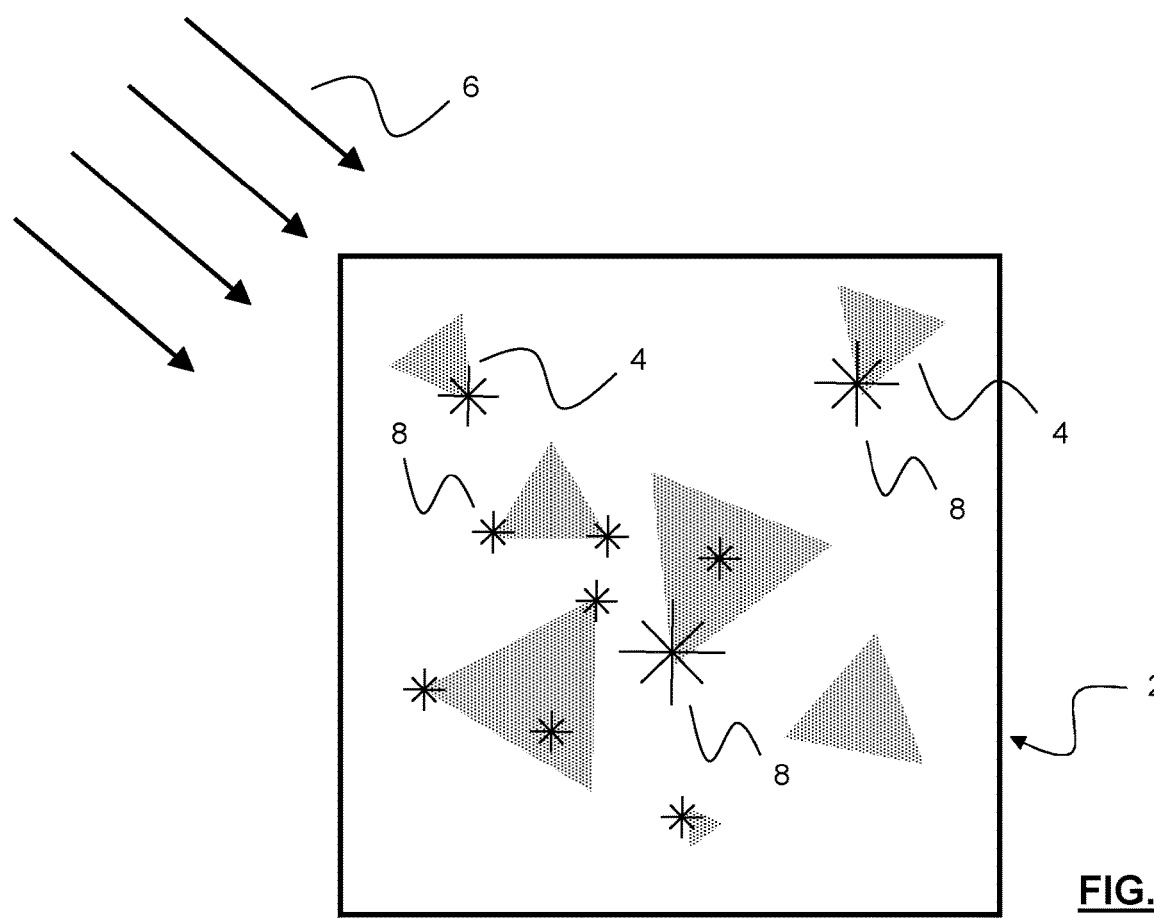

(51) Int. Cl.
*G06V 20/80* (2022.01)
*G06V 20/00* (2022.01)

(58) Field of Classification Search
USPC .................. 235/494, 487, 375, 435, 454
See application file for complete search history.

(56) References Cited

FOREIGN PATENT DOCUMENTS

| | | | |
|---|---|---|---|
| GB | 2543126 A | 4/2017 |
| JP | H06152050 A | 5/1994 |
| JP | H08316583 A | 11/1996 |
| WO | 2015150739 A1 | 10/2015 |
| WO | 2016120608 A1 | 8/2016 |

* cited by examiner

METHOD OF MAKING AN OPTICALLY READABLE ELEMENT

The present invention relates generally to a method of making an optically readable element, and to a system for making an optically readable element, and to a related optically readable element, for example one made using the method or system.

An optically readable element can take one of a range of different forms. Such an element may be read by an electronic sensor or similar, or by the eye of a human user. In one example, an optically readable element might be or form part of a display device, or general visual display. In another example, an optically readable element may be used for different purposes, or for simultaneous purposes, for example for use in providing or otherwise determining a unique identifier. For instance, an optically readable element might take the form of a barcode, QR code, a hologram, a smart ink, or other form of identifier, or similar. The optically readable element might be, take the form of, or otherwise provide a physically (or physical) unclonable function (PUF).

Many years ago, optically readable elements may have been rather simplistic or even classical in form, for example comprising a painted surface, a lightbulb behind a coloured filter or similar, all the way through to a rather basic black and white line barcode, or related QR code. However, in more recent years, optically readable elements have become more advanced and more sophisticated, for example relying on semiconductor structures, structures exhibiting quantum mechanical confinement, and generally structures that have an intrinsic band structure that is directly related to the optical properties of the structure. Existing methods and systems for making such optically readable elements comprising such band structures might be suitable in certain circumstances, performing and creating optically readable elements as intended for the application in question.

However, while the intrinsic band structures of such optical structures may give advantageous properties in some examples, for example in terms of electromagnetic radiation emission profiles or energy efficiencies, those same band structures may provide disadvantageous features, for example undesirable or unintended electromagnetic radiation emission profiles. It may therefore be desirable to ensure that such emission profiles are in some way controlled or controllable to realise a desirable emission profile. Perhaps counterintuitively, the somewhat opposite situation might also arise, where it may be desired to ensure that an emission profile is altered or otherwise changed for use in establishing or improving a unique identity provided by the related optical structures, for example establishing or increasing the 'uniqueness' of a physically unclonable function provided by those structures.

It is an aim of example embodiments of the present invention to at least partially avoid, solve or overcome one or more disadvantages of the prior art, whether identified herein or elsewhere, or to at least provide an alternative to existing approaches in the prior art.

According to example embodiments of the present invention, there is provided a method of making an optically readable element, a system for making an optically readable element, and optically readable element, all as defined in the independent claims. Additional features will be apparent from the dependent claims, and the present disclosure as a whole.

According to a first aspect of the present invention, there is provided a method of making an optically readable element, the method comprising: providing one or more optically readable structures in or on a body, a strain being applied to the one or more optically readable structures as a result of an interaction between the body and the one or more optically readable structures; the one or more optically readable structures each having an intrinsic band structure prior to application of the strain, and wherein the applied strain changes that intrinsic band structure; and wherein the interaction is such that the strain is maintained, after the element has been made, without the need for an external influence.

The interaction may be based on a change in state of the body from a first state to a second state.

The change in state is linked to one or more of, or a combination of: at least partial solidification of the body; and/or thermal expansion or contraction of the body; and/or curing of the body.

A second body may be provided, covering at least a part of the body in or on which the one or more optically readable structures have been provided.

The provision of the second body might also apply a strain to the one or more optically readable structures as a result of a direct or indirect interaction between the second body and the one or more optically readable structures.

One or both of the body and the second body may provide one or more of, or a combination of: optical filtering with respect to optical reading of the one or more optically readable structures; and/or protection for the one or more optically readable structures; and/or stabilisation of an optical property of the one or more optically readable structures; and/or a degree of control of an average strain at an interface between the body and the second body.

One or more optically readable structures may be provided in or on a support. The providing one or more optically readable structures in or on the body may comprise locating the support on the body. The interaction may be directly between the body and the one or more optically readable structures, and/or the interaction may be indirectly between the body and the one or more optically readable structures via the support.

The applied strain may be controlled, in terms of magnitude and/or direction of the applied strain.

The applied strain may be uncontrolled, in that it is not possible to (e.g. easily) predict (e.g. without inspection or testing) a particular magnitude and/or a particular direction of the applied strain on one, more or all of the one or more optically readable structures.

The one or more optically readable structures may be or comprise one or more continuous (e.g. a layer, optionally comprising defects) or discrete components (e.g. dots, particles, flakes) exhibiting quantum mechanical confinement, the or each component having an intrinsic band structure prior to application of the strain, and wherein the applied strain changes that intrinsic band structure. The change in band structure is in order to change an optical property of the component linked to that quantum mechanical confinement. The confinement of the one or more continuous or discrete components optionally confines in one or more of 3D, 2D, or 1D, or 0D.

The one or more optically readable structures may comprise a 2D material, or may confine in 2D, or may comprise 0D quantum dots or may confine in 0D. The strain may optionally be axially applied to the body, e.g. such that the material is strained along/parallel to its length or width, and not across its depth.

The interaction may be such that the strain is maintained, after the element has been made, without the need for an external influence in the form of one or more of: an externally applied temperature change; an externally applied force. That is, without external influence, the applied strain is maintained.

According to a second aspect of the present invention, there is provided a system for making an optically readable element, the system comprising: a dispenser for providing one or more optically readable structures in or on a body, a strain being applied to the one or more optically readable structures as a result of an interaction between the body and the one or more optically readable structures; the one or more optically readable structures each having an intrinsic band structure prior to application of the strain, and wherein the applied strain changes that intrinsic band structure; and wherein the interaction is such that the strain is maintained without the need for external influences, after the element has been made.

The system may also comprise an optical reader for optically reading the one or more optically readable structures of the optically readable element, e.g. as or just after the strain has been applied.

According to a third aspect of the present invention, there is provided an optically readable element comprising: one or more optically readable structures in or on a body, a strain being applied to the one or more optically readable structures as a result of an interaction between the body and the one or more optically readable structures; the one or more optically readable structures each having an intrinsic band structure prior to application of the strain, and wherein the applied strain changes that intrinsic band structure; and wherein the interaction is such that the strain is maintained without the need for external influences, after the element has been made.

It will be apparent to the skilled person, after reading this disclosure, that one or more features described in relation to any one or more aspect of the present invention may be used in combination with, or in place of, any one or more features of the another aspect of the present invention, unless such combination or replacement would be understood by the skilled person as mutually exclusive. In particular, it is to be made clear that any features described or defined in relation to one or more of the method, system or element aspects may be interchanged with or used in combination with any one or more of the method, system and element aspects.

Figure 2:
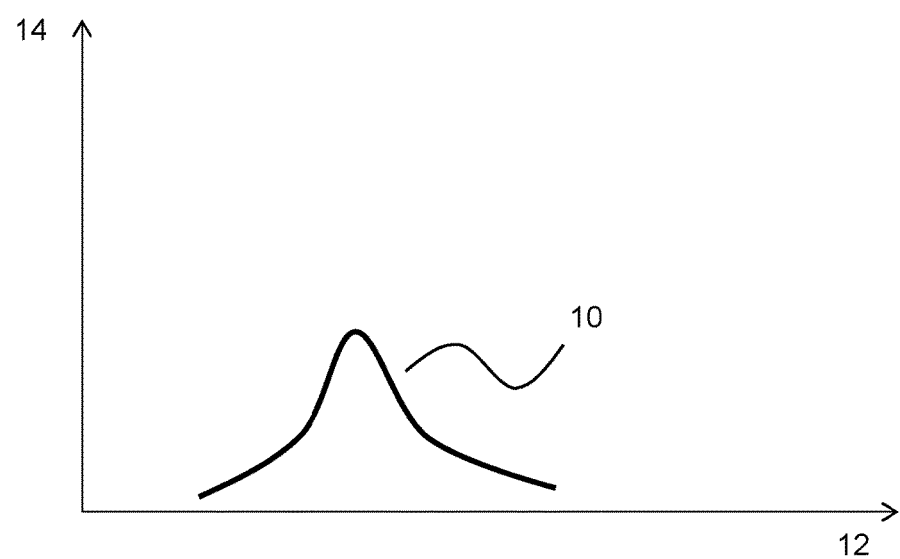
Figure 3:
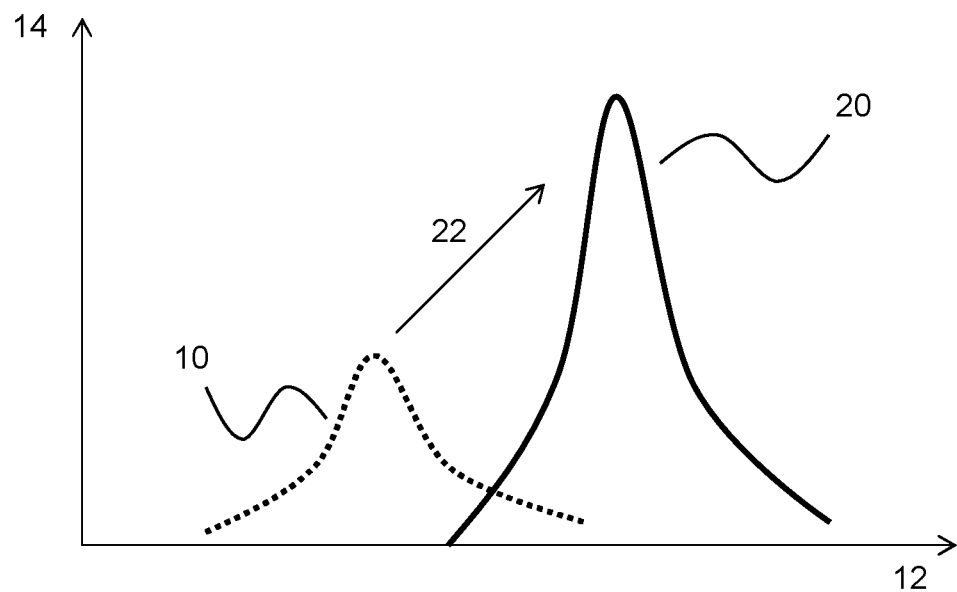
Figure 4:
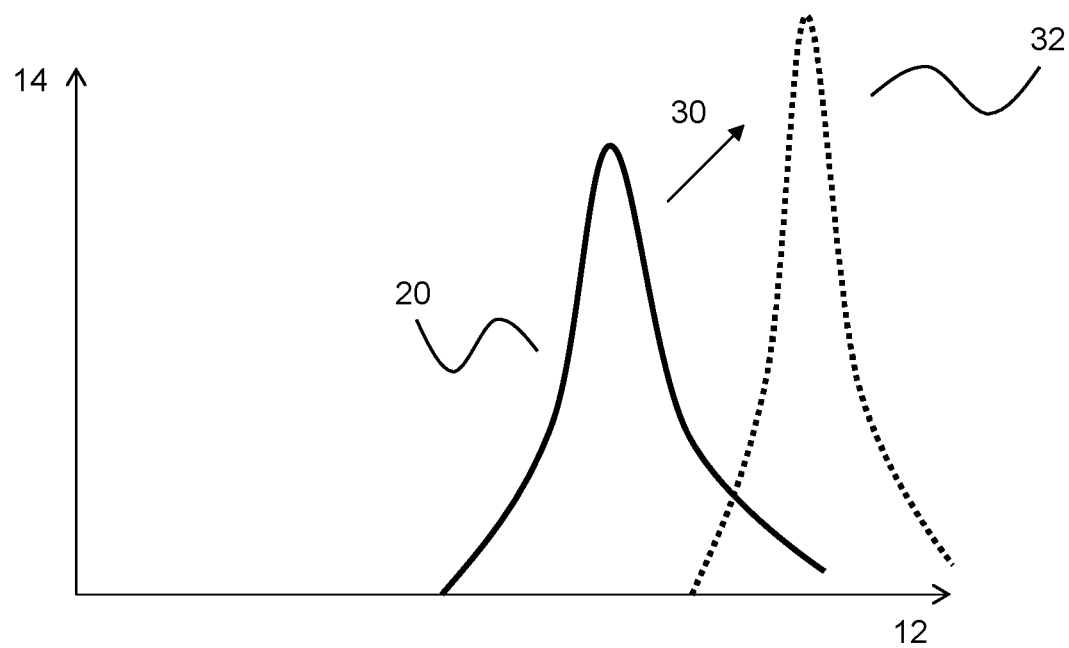
Figure 5:
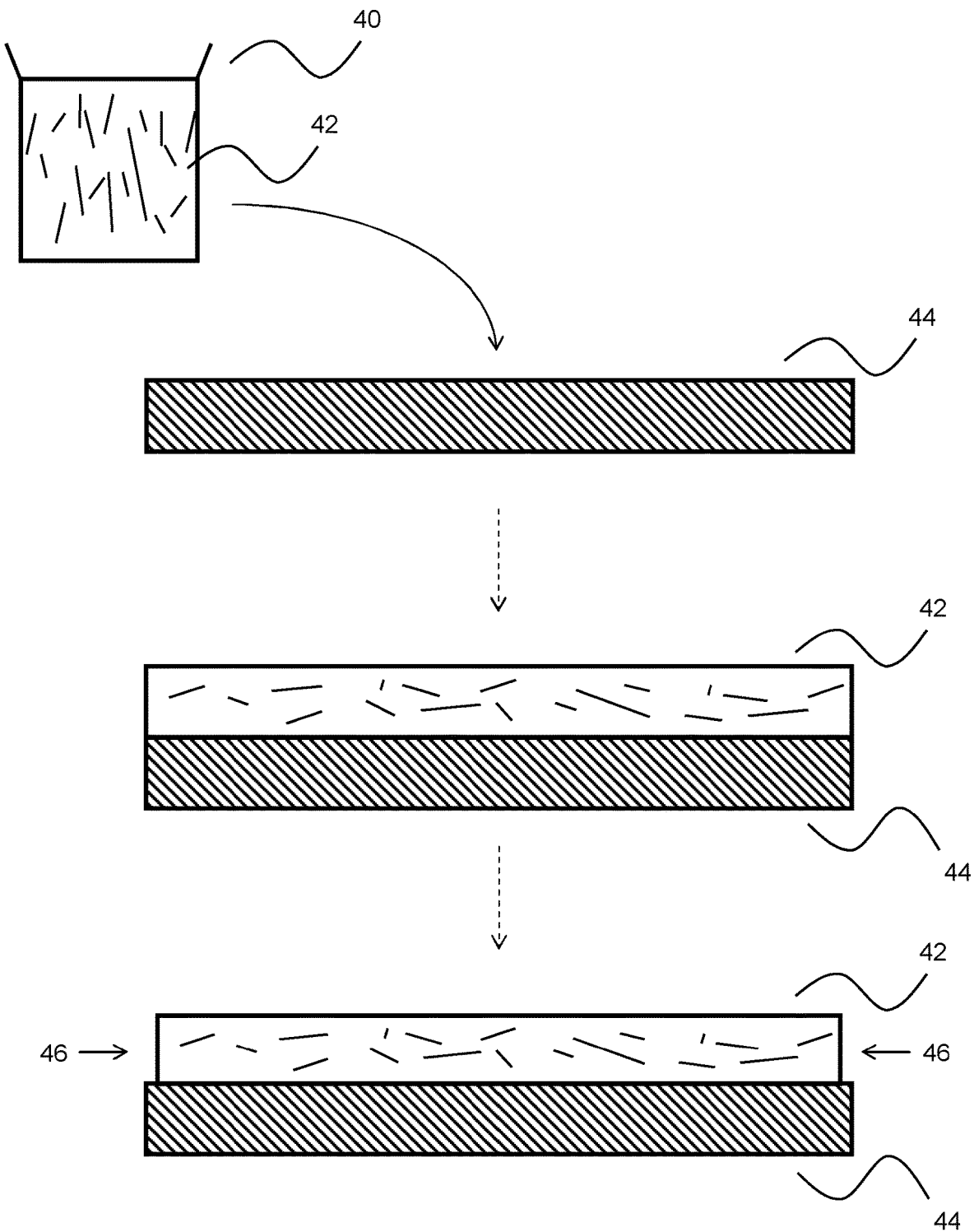
Figure 6:
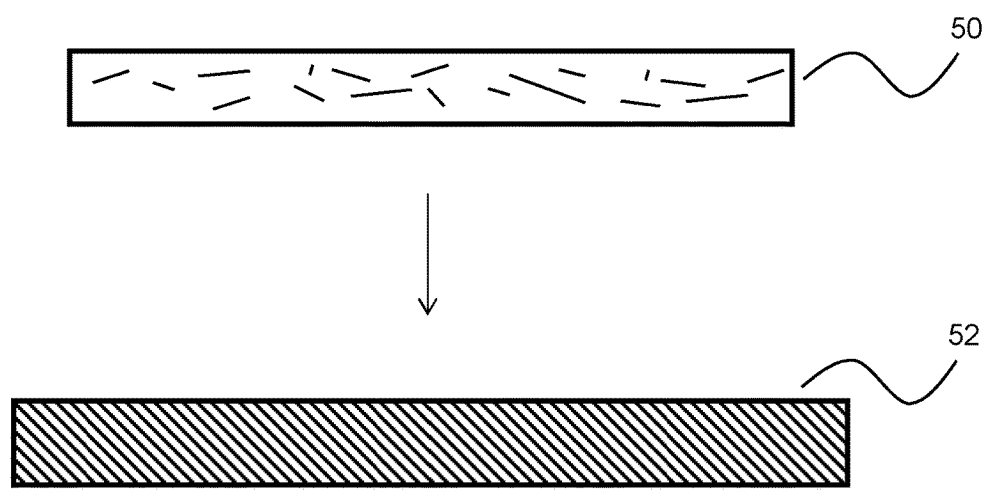
Figure 7:
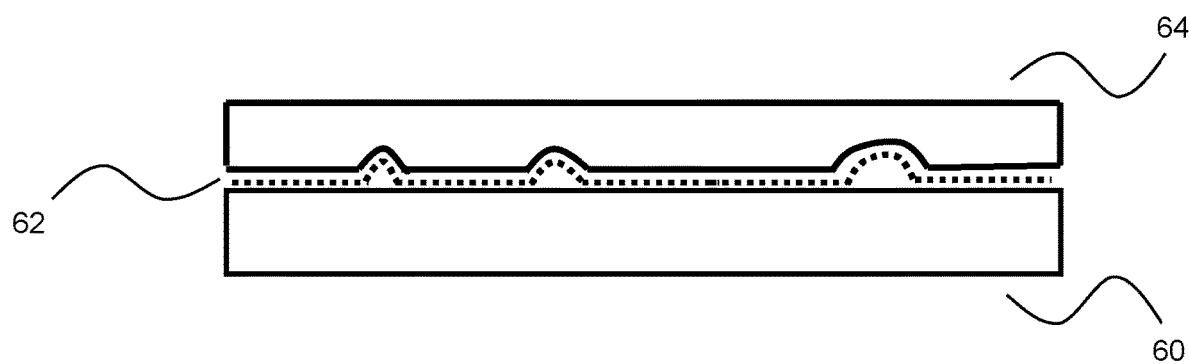
Figure 8:
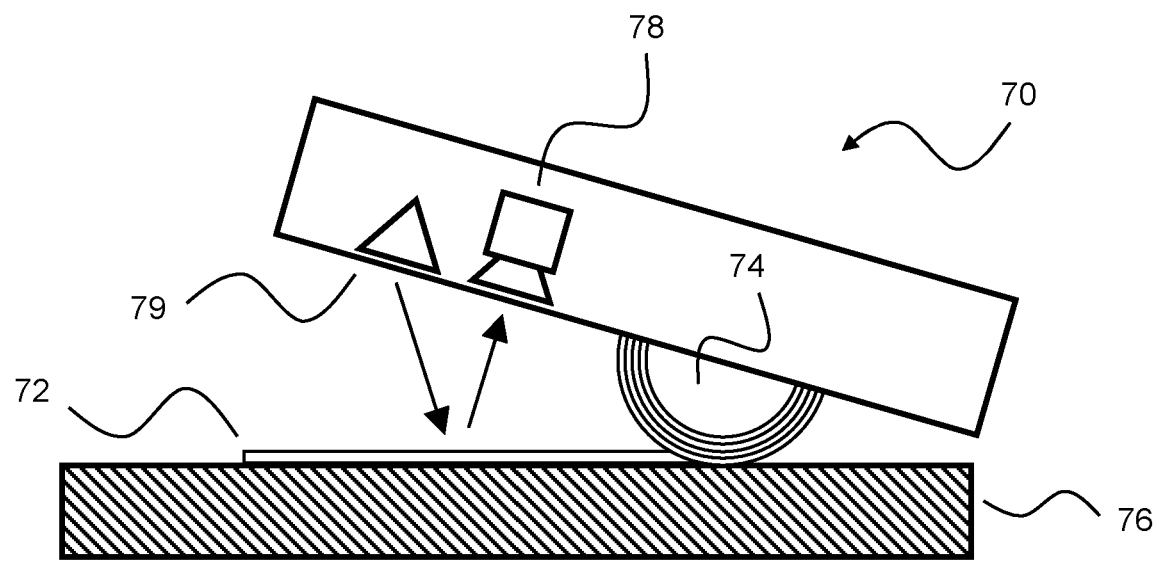
Figure 9:
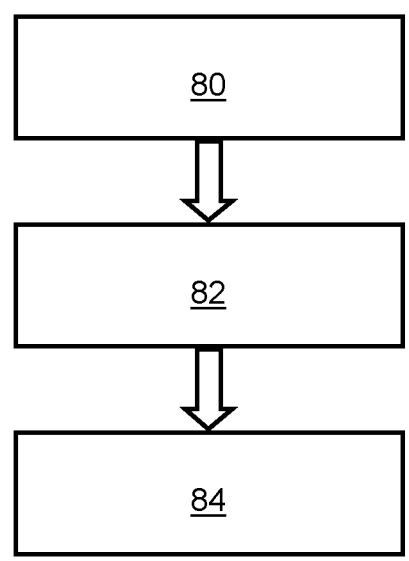
Figure 10:
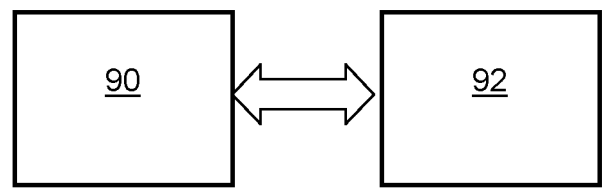
Figure 11:
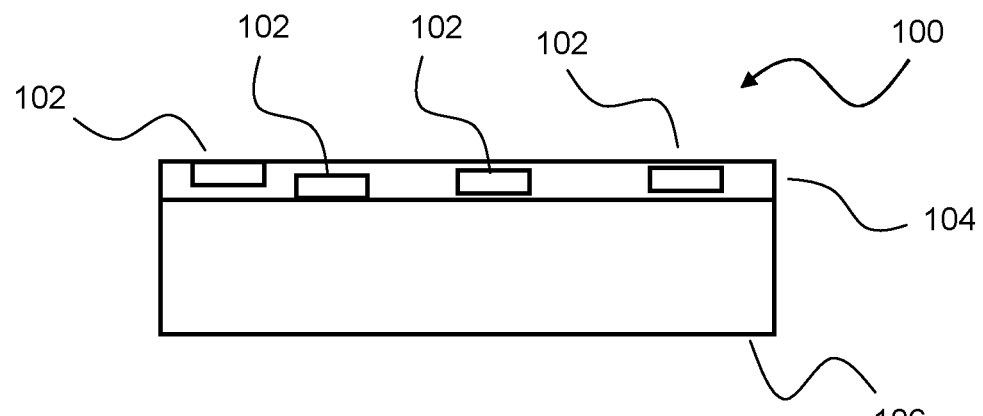

For a better understanding of the invention, and to show how embodiments of the same may be carried into effect, reference will now be made, by way of example, to the accompanying diagrammatic Figures in which:

FIG. 1 schematically depicts an optically readable element, and related principles of use;

FIG. 2 schematically depicts a graph of an emission profile of an optically readable structure of the element of FIG. 1;

FIG. 3 schematically depicts a change in the emission profile of FIG. 2, with applied strain;

FIG. 4 schematically depicts a graph showing a change in the emission profile of FIG. 3, with further applied strain;

FIG. 5 schematically depicts methodology associated with a method of making an optically readable element according to an example embodiment;

FIG. 6 schematically depicts methodology associated with a method of making an optically readable element according to another example embodiment;

FIG. 7 schematically depicts methodology associated with a method of making an optically readable element according to another example embodiment;

FIG. 8 schematically depicts a system for making an optically readable element, in accordance with an example embodiment;

FIG. 9 is a flow chart schematically depicting general methodology for making an optically readable element, according to an example embodiment;

FIG. 10 schematically depicts general principles of a system for making an optically readable element, according to an example embodiment; and FIG. 11 schematically depicts general principles associated with an optically readable element, according to example embodiments.

It is known that applying a strain to an optically readable structure having an intrinsic band structure can be used to alter that intrinsic band structure, in order to alter optical properties of that optically readable structure. This includes the structure being optically readable, or more easily optically readable, or readable in a certain manner, only when or after strain has been applied. That is, the application of strain ensures that the structure (e.g. a semiconductor structure or more generally a structure having an intrinsic band structure) becomes optically readable in a certain manner—e.g. from being optically readable to note that it does not emit, to optically readable to note that it does emit. For the purposes of this disclosure, and for simplicity, this is still generally to be understood as an optically readable structure.

Altering the band structure might be defined or described as altering or changing a profile of a conduction band, or a profile of a valence band, or a profile between such bands, or any alteration of the structure in general. In existing approaches, changing of such properties has been undertaken in a laboratory or experimental fashion, for example using an external (to the structure or element) heating stage that carefully controls a temperature or temperature change applied to the optically readable structures, or by carefully controlling an external force that is applied to the structures, or element in general. However, according to example embodiments of the present invention, it has been realised that changes or alterations in the intrinsic band structure can be in-built, such that the changes are maintained after the optically readable element has been made, which is not the case for the approaches discussed previously. In other words, the changes or alterations in the intrinsic band structure can be in-built, and do not require external influences (e.g. externally originating temperature changes or forces) to achieve. This means that no external power is required to maintain the strain. For example, if the element is attached to an object, the strain remains, either intrinsically or via interaction with that object, yet no external heating stage or powered actuator is required.

According to the present invention, there is generally provided a method of making an optically readable element. The method comprises providing one or more optically readable structures in or on a body. A strain is applied to the one or more optically readable structures as a result of an interaction between the body and the one or more optically readable structures. That is, an external influence is not required. The one or more optically readable structures each have an intrinsic band structure prior to the application of the strain. The applied strain changes that intrinsic band structure, and thus one or more optical properties of the optically readable structure or structures.

The interaction is such at the strain is maintained after the element has been made, without the need for an external influence (e.g. externally applied temperature change or externally applied force). This means that the change in optical property can be maintained and permanently realised, for example in use of, or otherwise general interaction with, the optically readable element.

The changes in the intrinsic band structure across one or more optical readable elements may be undertaken in one example to improve optical output or performance, for example improving uniformity of optical output across one or more optically readable structures, or in some way tuning the output to a desired output (e.g. wavelength or similar). Conversely, the changes that are in-built may be such that a random or nondeterministic strain is applied, to ensure that a random or nondeterministic change in band structures is realised, which can for example be used to create or strengthen a unique identifier associated with the optically readable structure or structures (e.g. one or more readable optical properties of any one or more optical structures across the optically readable element).

The Figures will now be used to describe features of, or relating to, the present invention. The Figures are not drawn to any particular scale.

FIG. 1 schematically depicts a plan view of an optically readable element 2. The optically readable element 2 comprises a number (e.g. one or more, but in this example more than one) optically readable structures 4. The optically readable structures 4 each have an intrinsic band structure which dictates the optical properties of the optically readable structure 4. For example, changes to the intrinsic band structure might alter an emission strength and/or wavelength of the structure 4, as well as absorption properties. This will, of course, impact how electromagnetic radiation is emitted (which includes reflecting or scattering) from the structures 4.

In the example of FIG. 1, the optically readable structures 4 comprise or take the form of flakes of a two-dimensional (2D) material. However, and more generally, the one or more optically readable structures 4 could comprise one or more continuous (e.g. a layer, optionally comprising defects) or discrete (e.g. dots, particles, flakes) components exhibiting quantum mechanical confinement. Typically, such structures will have the intrinsic band structure discussed herein, but will also have particularly useful properties in terms of particular emission or absorption wavelengths, or sharp transitions, energy efficiencies, etc. The confinement might typically be in one or more of 3D, 2D, 1D or 0D. As discussed herein, strain may be used to change the band structure of such materials, and thus the optical properties of such materials. 2D materials or those materials exhibiting 2D confinement (e.g. flakes or layers), or 0D materials or materials exhibiting 0D confinement (e.g. quantum dots), are known to be particularly susceptible to the application of strain, and so might find particular use in the application of the present invention. This is particularly true when the strain is applied axially with regard to the structure in question.

A 2D material might be defined or described as a material that is atomically thin in one dimension only, e.g. not necessary a single layer of a few atoms thick, but thin enough that electrons behave quantum mechanically, for example being confined and/or such that motion of electrons into, and out of, a two dimensional plane of the material is governed by quantum mechanical effects. The minimum width/depth/dimension is material-dependent.

FIG. 1 shows the optically readable element 2 being irradiated with excitation electromagnetic radiation 6. The excitation 6 causes the optically readable structures 4 to emit 8 emission radiation, for example by (e.g. non-resonant) photoluminescence. FIG. 2 shows a simplified representation of an emission spectrum 10 (or profile) for an optically readable structure 4, or for part of such a structure 4. The emission spectrum 10 is shown on a graph of emission wavelength 12 versus emission intensity 14. For this particular explanation, the exact numerical details are not of significant consequence for explaining underlining principles relating to the present invention.

FIG. 3 is another graph, this time showing the change in an emission profile 20 (compared with that in FIG. 2) as a result of strain 22 being applied to the optically readable structure exhibiting that profile. The strain is in-built, in that it is intrinsically locked-in to the element, such that the strain is applied without the need for external influences.

Again, while the numerical or otherwise quantitative details of the change emission profile are largely irrelevant for a general appreciation of the principles underlying the present invention, it can be seen that the application of strain 22 has changed the intrinsic band structure of the optically readable structure, which has in turn had an impact on its emission profile 20.

It will appreciated that this strain 22, can be used to ensure that the resulting emission profile 20 is a desired emission profile 20, for example one having a particular emission wavelength or similar. This approach might therefore be used to tune the optical properties of those structures, for example selectively across one or more areas of the optically readable element comprising one or more optically readable structures. In a crude example, the emission may be made to be bluer, or redder, or generally a different colour, and so on.

FIG. 4 is, again, a graph similar in form to those already shown in and with described reference to FIGS. 2 and 3 above. However, this particular graph shows how the emission profile 20 shown in FIG. 3 may, itself, be changed with the application of further strain 30 to a new, and different, emission profile 32. This change or further change in profile 32 due to the strain changing 30 could be used, for example, to further change the profile so that it is a desired emission profile 32. Again, this change could be a deliberate locked-in change as part of manufacturing of the element.

However, in some examples, perhaps the opposite is true. For example, if the change in strain 30 (or simple strain in general) is not known, for example in terms of its magnitude or its direction or similar, then the change in emission profile 32 may also not be known in advance. In other words, an unknown or random (e.g. change in) strain 30 should result in an unknown or a random change in the emission profile 32. This effect can be used to introduce or strengthen a unique identifier provided by the one or more emission profiles of the one or more optically readable structures of the optical element, or to strengthen this unique identifier. For instance, if the one or emission profiles (or data indicative thereof) were mapped for one or more emission locations across the optically readable element (e.g. for one or more optically readable structures), then this might be used to provide a unique identifier or fingerprint for the optically readable element, which could be used in providing authentication or proving authenticity of the optically readable element, or a device or other object to which the element is attached. In this scenario, the effect of introducing some form of random or non-deterministic strain across the element, and therefore to the one or more optically readable structures, could be viewed in a number of different ways.

For one example, even if it is somehow possible (although of course extremely unlikely) to replicate the location of the one or more optically readable structures, and their physical composition, to in some way mimic or fool an authentication system or element (in other words, to try clone the optical element), it would be even harder to try and replicate some form of in-built and randomly introduced strain. The strain, or strain field, adds an extra dimension of security to the element, making it harder to copy. The physical properties of quantum materials (e.g. those having intrinsic band structures, and optionally exhibiting confinement) are much more sensitive to strain than classical materials. In this way the optical changes induced by the random strain field also act to highlight the actual presence of quantum materials, as opposed to a material (e.g. counterfeit or otherwise) pretending to be such a material—i.e. the introduction of strain is in some ways a check for the presence of quantum materials (e.g. those having intrinsic band structures, and optionally exhibiting confinement).

From another perspective, if an optically readable element already had a strain-field built into its structure by interaction between a body of material and the optically readable structures in or on that body, then the optical properties of the one or more optically readable structures across the optical element will have unique emission profiles, leading to a fingerprint or a unique identifier for the optically readable element. The same is true, even if the strain-field is zero. If, however, the strain-field is then changed, this means that the optical properties of the optical readable structures will also change. This will, of course, change the fingerprint or unique identifier provided by the optical element. The reasons why this might be useful might, in fact, be counterintuitive. One reason is that if the optical element is tampered with, for example delaminated or removed from a product, or otherwise bent or deformed and so on, this will impact that strain-field. So, whereas the optical element might pass some authentication test or process in one instance, it may not pass a second, subsequent authentication process or test at a second instance, after such tampering has taken place, as a result of changes in the strain-field and consequent changes in the identifier or fingerprint provided by the changes in the optical structure of the element. So, in summary, in this particular example, changes in the in-built strain-field may be used an anti-tampering mechanism or process. The exact nature or changes of the strain or resulting optical properties do not necessarily need to be qualified or quantified, and all that needs to happen is for the degree of strain to be sufficient to change the fingerprint, signature or unique identifier of the device to something different to that recognised or determined previously, so that any authentication process is no longer passed. Therefore, the anti-tampering mechanism is very simple to implement, yet extremely hard to avoid. This sort of anti-tampering is not possible with classical materials.

When used in a security or authentication environment or application, the optically readable element might be defined or described as an optically readable security element, an optically readable identifier, an optically readable PUF, and so on.

Various approaches may be used to establish an in-built strain or strain-field within the optical element. Different examples will now be described.

FIG. 5 schematically depicts a container 40, containing a solution of polymer and optically readable structures in the form of flakes of 2D material 42. The solution 42 is then provided on a substrate or other support 44.

Over time, and as part of the manufacturing process of an optical element using the solution 42 and substrate 44, the solution 42 will change from a first state to a second state, which will result in a strain 46 being applied to optically readable structures in that solution. The change in state from the first state to the second state may be any one or more of, or a combination of, at least partial solidification of the body in which the optically readable structures are located; thermal expansion or contraction of that body; or curing of the body. These changes might be changes directly associated with the body, or indirectly via an interaction with the substrate 44 or other support.

In this example, the body may be one or more parts of the solution, or simply a matrix or other material in which the optically readable structures are present. Changes to the body will directly or indirectly impact the optically readable structures, such that if a strain-field is induced within the body, strain will be applied, and maintained, to the optically readable structures.

The final body-substrate 42, 44 combination may form the optically readable element discussed above. The body might form a film or other layer on the substrate 44. The substrate 44 may not form a part of the final optically readable element. That is, the body 42 might be removed, once cured or similar.

The application or final 'setting' of the body may be undertaken in something of a controlled manner, for example in terms of a direction of application, or a condition during setting, such that the degree of strain is in someway controlled, for example in terms of direction or magnitude. This might be helpful, for example, in ensuring or improving some form of uniformity in the applied strain, and the resulting changes in optical properties of the optically readable structures. In another example, there may, very deliberately, be little or no consideration given to the degree of control of application or setting of the body, such that the results of the strain-field applied on or within the body and thus to optically structures, is random. Randomness can sometimes improve overall or average uniformity, e.g. when the element is taken as whole, or read from a great distance. However, randomness gives localised non-uniformity, giving or strengthen a unique identifier, as discussed above.

It will be noted that providing the one or more optically readable structures within a body of material might, or in some examples should, result in the optically readable structures being distributed not only across the body and optically readable element, but also within (that is, with different depths in) the body of the optically readable element. This might allow for an optical reading of the optically readable element to have an angular dependence—i.e. the reading changes with angle, due to a 3D distribution of optically readable structures within the optically readable element. This might add another dimension to the security or uniqueness of the element, making it even harder to copy. This is opposed to a purely 2D distribution, that might be easier to replicate.

Depending on the application in question, the body in or on which the optically readable element is provided may be rigid or flexible. In some examples, a rigid application might be desired such that the resulting structure is either resistant to damage to give robustness, or is very susceptible to damage making it harder to tamper with. Alternatively, a flexible configuration might be advantageous, so that the optically readable can be flexed without damage and therefore be more robust, or so that the element can be flexed and returned to its original configuration without a permanent change to its in-built strain-field, which could otherwise compromise future authentications of that element.

FIG. 6 shows how one or more optically readable structures have been provided in a support polymer matrix or body 50. For instance, the overall structure might comprise a number of optically readable structures embedded in a film or tape-like structure 50. The structure (support and optically readable structures) 50 may be applied to another body 52 in the form of a substrate or similar. This application, or the resulting settling or establishing of some form of equilibrium relationship, may result in there being a differential relationship between the body 52 and the support 50. This might result in an interaction which results in a strain being applied directly or indirectly to the structures with the support 50. Again, a strain-field is provided, impacting the optical properties of the optically readable structures. Alternatively, there might already be a strain-field built into the structure 50 prior to application. Application might not change this field. Application might change this field.

To some extent, the terms "support" and "body" may be used interchangeably. The point is that some form of interaction results which changes or otherwise impacts the strain applied to the optically readable elements. This could be treated in a number of different ways, as already discussed above, and further below. So, the strain could be in-built within the body in an intrinsic manner. Or, applying a support to a body (or vice versa) might establish the required in-built strain-field. This means that no external power is required to maintain the strain. For example, if the element is attached to an object, the strain remains, either intrinsically or via interaction with that object, yet no external heating stage or powered actuator is required.

FIG. 7 schematically depicts a different optically readable element. A first body is provided, for example in the form of a first polymer layer 60. On top of that polymer layer 60 is provided a layer of optically readable structures, optionally within a polymer matrix or other body of material. Located on top of those optically readable structures 62 is a second body 64, for example a second polymer layer 64.

Different degrees or extents of strain can be applied to the optically readable structure 62 for a number of different reasons. Application of the optically readable structures to the first layer 60 may result in a strain-field being induced, for example as described in relation to FIG. 5. Alternatively or additionally, the provision of the second layer 54 on top of the optically readable structure 62 may have a similar effect—i.e. introduction of a strain-field to the optically readable structures 62. Indeed, the strain-field introduced to the optically readable structures will likely have a contribution from each of the layers 60, 64, and to that extent the strain-field might at least be partially controlled (for example at least an average strain or similar) by consideration or appropriate choice of the nature of the first layer 60 and second layer 64 and or related processing conditions.

The presence of the second body 64 might, in particular, have advantages in addition to or separate from any introduction or contribution to a strain-field. For instance, the second body 64 or layer might provide optical filtering with respect to optical reading of the one or more optically readable structures 62. The second layer 64 might provide protection for the one or more optically readable structures 62. The second layer 64 might provide a degree of encapsulation (e.g. stabilisation) of an optical property of the one or more optical readable structure 62, for example, preventing the optical property from drifting or degrading overtime or at least a significant period of time.

Generally, the bodies or supports described herein have one or more properties or functions as described in relation to the second body of FIG. 7. The bodies or supports described herein might be transparent, at least to excitation or emission electromagnetic radiation used in the reading of the element or its structures.

FIG. 8 schematically depicts a system for making (which includes providing) an optically readable element 72. The system 70 comprises a dispenser 74, for providing one or more optically readable structures in or on a body, a strain being applied the one or more optically readable structures as a result of interaction between the body and the one or more optically readable structures. The structures and/or body may be provided on a substrate or other support 76 which may, depending on the nature of application, be an article to which the optical element 72 is to be attached, or which may form part of the optical element, for example a backing or support layer.

The manner in which the dispenser 74 dispenses the optically readable structures (which may include a related body in or on which the structures are provided) may depend on the particular application for the optically readable element. For example, the optically readable structures may be dispensed in a manner similar to that shown in relation to FIG. 5, for example in solution or fluidic-matrix form. However, the dispenser 74 might dispense the material in a different way, similar to that shown in FIG. 6, where a sheet or strip in the form of a role or tape is dispensed by the dispenser 74, for example as the dispenser 74 or system 70 is moved relative to and across the support or substrate 76.

Conveniently, the system might comprise an optical reader 78 which may be employed to optically read the optically readable structures (or the optically readable element in general) as the dispensing takes place. This means that the application and reading of the structures or elements in general can be taken very quickly and very efficiently by the same system. While this may be convenient in general, this might also be important for anti-counterfeiting or similar. If the unique fingerprint or identifier provided by the one or more optically readable structures is read immediately upon application (or very shortly afterwards) then any tampering at some later time will be easily identifiable or actionable, either by noting the change in signature, or unique identity, or fingerprint, or simply by way of any subsequent authentication check of the optically readable element failing due to changes in a strain-field caused by tampering of or with the optically readable element.

The optical reading may be undertaken by the optical reader 78 in ambient or generally environmental lighting conditions. However, the system 70 might comprise a dedicated excitation source 79 for use, for example, in exciting the optical readable structures for appropriate reading by the reader 78.

FIG. 9 schematically depicts a flow chart which identifies general principles underlying the inventive concept. The method might comprise providing one or more optically readable structures in or on a body 80. A strain is applied to the one or more optically readable structures as a result of an interaction between the body and the one or more optically readable structures 82. The one or more optically readable structures each have an intrinsic band structure prior to application of the strain. The applied strain changes that intrinsic band structure. The interaction is such that the strain is maintained, after the element has been made, without the need for an external influence 84 (e.g. externally applied heat on an externally applied force).

FIG. 10 schematically depicts similarly generic principles associated with a system for making an optically readable element according to example embodiments. The system comprises a dispenser 90 for providing one or more optically readable structures in or on a body, such that a strain may be applied to the one or more optically readable structures as a result of an interaction between the body and the one or more optically readable structures. The one or more optically readable structures each have an intrinsic band structure prior to application of the strain. The applied strain changes that intrinsic structure. The interaction between the body and the one or more optically readable structures is such that the strain is maintained without the need for an external influence, after the element has been made. As discussed more specifically above, the system might more generically include some form optical reader 92 for optically reading the optically readable structures as, or after, e.g. relatively quickly after, the optical readable element has been made or applied to some other support, body, or other structure (that is, when the strain field that is to be relied upon for authentication or other functionality has been established and maintained).

The system might be arranged to, and/or include a part of component to, apply the optically readable element to a surface. This could be the dispenser, or could be something else or additional, for example for use in attached an element to a surface using an adhesive or other fixing body or structure.

FIG. 11 schematically depicts general principles of an optically readable element 100 in accordance with example embodiments. The element 100 comprises one or more optically readable structures in or on a body 104. A strain is applied to the one or more optically readable structures 102 as a result of an interaction between the body 104 and the one or more optically readable structures 102. The one or more optically readable structures 102 each have an intrinsic band structure prior to application of the strain. The applied strain changes that intrinsic band structure, and thus the optical properties of the optically readable structure. The interaction is such that the strain is maintained without the need for external influences, after the element 100 has been made. The structure 102 and body 104 may be located on a support or other body 106 which may form part of the element 100, or which may be used in the formation of the optically readable element 100. The body itself 104 may be formed from setting or curing of some fluidic substance or similar. Alternatively or additionally, the body 104 might be described as a support or similar, and take the form of a tape or reel or film previously provided and applied to the underlying support structure or substrate 106.

Although a few preferred embodiments have been shown and described, it will be appreciated by those skilled in the art that various changes and modifications might be made without departing from the scope of the invention, as defined in the appended claims.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method of making an optically readable element, the method comprising:
    providing one or more optically readable structures at least in or on a body, a strain being applied to the one or more optically readable structures as a result of an interaction between the body and the one or more optically readable structures;
    the one or more optically readable structures each having an intrinsic band structure prior to application of the strain, and wherein the applied strain changes the intrinsic band structure;
    and wherein the interaction is such that the strain is maintained, after the element has been made, independently of an external influence.

2. The method of claim 1, wherein the interaction is based on a change in state of the body from a first state to a second state.

3. The method of claim 2, wherein the change in state is linked to at least one of:
    at least partial solidification of the body; and/or
    thermal expansion or contraction of the body; and/or
    curing of the body.

4. The method of claim 1, wherein a second body is provided covering at least a part of the body in or on which the one or more optically readable structures have been provided.

5. The method of claim 4, wherein the provision of the second body also applies a strain to the one or more optically readable structures as a result of a direct or indirect interaction between the second body and the one or more optically readable structures.

6. The method of claim 4, wherein one or both of the body and the second body provide at least one of:
    optical filtering with respect to optical reading of the one or more optically readable structures;
    protection for the one or more optically readable structures;
    stabilisation of an optical property of the one or more optically readable structures; and
    control of an average strain at an interface between the body and the second body.

7. The method of claim 1, wherein one or more optically readable structures are provided in or on a support, and the providing one or more optically readable structures in or on the body comprises locating the support on the body, the interaction being directly between the body and the one or more optically readable structures, and/or the interaction being indirectly between the body and the one or more optically readable structures via the support.

8. The method of claim 1 further comprising controlling at least the magnitude and/or direction of the applied strain.

9. The method of claim 1, wherein the applied strain is uncontrolled, such that a particular magnitude and/or a particular direction of the applied strain on at least one of the one or more optically readable structures is unpredictable.

10. The method of claim 1, wherein the one or more optically readable structures comprises one or more continuous or discrete components exhibiting quantum mechanical confinement, each component having an intrinsic band structure prior to application of the strain, and wherein the applied strain changes the intrinsic band structure to change an optical property of the component linked to that quantum mechanical confinement, wherein the confinement of the one or more continuous or discrete components confines in one or more of 3D, 2D, or 1D, or 0D.

11. The method of claim 1, wherein the one or more optically readable structures comprises a 2D material, or confines in 2D, or comprises 0D quantum dots or confines in 0D, and the strain is axially applied to the body.

12. The method of claim 1, wherein the interaction is such that the strain is maintained, after the element has been made, without an external influence in the form of at least one of an externally applied temperature change; or an externally applied force.

13. A system for making an optically readable element, the system comprising:
   a dispenser for providing one or more optically readable structures at least in or on a body, a strain being applied to the one or more optically readable structures as a result of an interaction between the body and the one or more optically readable structures;
   the one or more optically readable structures each having an intrinsic band structure prior to application of the strain, and wherein the applied strain changes the intrinsic band structure;
   and wherein the interaction is such that the strain is maintained independently of external influences, after the element has been made.

14. The system of claim 13, further comprising an optical reader for optically reading the one or more optically readable structures of the optically readable element.

15. An optically readable element comprising:
   one or more optically readable structures at least in or on a body, a strain being applied to the one or more optically readable structures as a result of an interaction between the body and the one or more optically readable structures;
   the one or more optically readable structures each having an intrinsic band structure prior to application of the strain, and wherein the applied strain changes the intrinsic band structure; and
   wherein the interaction is such that the strain is maintained independently of external influences, after the element has been made.

16. The optically readable element of claim 15, wherein the interaction is based on a change in state of the body from a first state to a second state.

17. The optically readable element of claim 15, further comprising a second body covering at least a part of the body having the one or more optically readable structures.

18. The optically readable element of claim 15, wherein one or both of the body and the second body are structured to provide at least one of:
   optical filtering with respect to optical reading of the one or more optically readable structures;
   protection for the one or more optically readable structures;
   stabilisation of an optical property of the one or more optically readable structures; or
   control of an average strain at an interface between the body and the second body.

19. The optically readable element of claim 15, wherein the one or more optically readable structures comprises one or more continuous or discrete components exhibiting quantum mechanical confinement, the or each component having an intrinsic band structure prior to application of the strain, and wherein the applied strain changes that intrinsic band structure, in order to change an optical property of the component linked to that quantum mechanical confinement, wherein the confinement of the one or more continuous or discrete components optionally confines in one or more of 3D, 2D, or 1D, or 0D.

20. The optically readable element of claim 15, wherein the one or more optically readable structures comprises a 2D material, or confines in 2D, or comprises 0D quantum dots or confines in 0D, and the strain is axially applied to the body.

* * * * *